(12) United States Patent
Usenko

(10) Patent No.: US 8,796,054 B2
(45) Date of Patent: Aug. 5, 2014

(54) GALLIUM NITRIDE TO SILICON DIRECT WAFER BONDING

(75) Inventor: Alexander Usenko, Painted Post, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 13/484,542

(22) Filed: May 31, 2012

(65) Prior Publication Data

US 2013/0320404 A1 Dec. 5, 2013

(51) Int. Cl.
*H01L 21/00* (2006.01)
*H01L 33/00* (2010.01)
*H01L 51/56* (2006.01)
*H01L 21/02* (2006.01)

(52) U.S. Cl.
CPC ............. *H01L 33/0079* (2013.01); *H01L 51/56* (2013.01); *H01L 21/02252* (2013.01)
USPC 438/29; 257/200; 257/E21.088; 257/E29.081; 438/455

(58) Field of Classification Search
USPC ............................ 257/200, E21.211; 438/458
See application file for complete search history.

(56) References Cited

U.S. PATENT DOCUMENTS

| | | | |
|---|---|---|---|
| 2007/0141814 A1 | 6/2007 | Leibiger et al. | 438/483 |
| 2008/0179547 A1 | 7/2008 | Henley | 250/492.21 |
| 2010/0244182 A1 | 9/2010 | Akiyama et al. | 257/506 |
| 2011/0012200 A1 | 1/2011 | Allibert et al. | 257/347 |
| 2011/0101373 A1 | 5/2011 | Arena et al. | |
| 2011/0159665 A1* | 6/2011 | Witte et al. | 438/458 |
| 2011/0207246 A1* | 8/2011 | Pitney et al. | 438/14 |

FOREIGN PATENT DOCUMENTS

JP    2007-230810    9/2007

OTHER PUBLICATIONS

Tauzin et al; "Transfers of 2-inch GaN Films Onto Sapphire Substrates Using Smart Cut™ Technology"; Electronics Letters, May 26, 2005, vol. 41 No. 11, 2 Pages.
PCT Application No. PCT/US2013/042380, filed May 23, 2013, Search Report and Written Opinion.

* cited by examiner

*Primary Examiner* — Ori Nadav
*Assistant Examiner* — Ernest Allen, III
(74) *Attorney, Agent, or Firm* — Michael W. Russell

(57) ABSTRACT

A direct wafer bonding process for joining GaN and silicon substrates involves pre-treating each of the wafers in an ammonia plasma in order to render the respective contact surfaces ammophilic. The GaN substrate and the silicon substrate may each comprise single crystal wafers. The resulting hybrid semiconductor structure can be used to form high quality, low cost LEDs.

9 Claims, 2 Drawing Sheets

GALLIUM NITRIDE TO SILICON DIRECT WAFER BONDING

BACKGROUND

The present disclosure relates generally to wafer bonding, and more particularly to a method of forming a substrate package that includes a gallium nitride layer that is bonded to a silicon support. The substrate package can be used in the manufacture of light emitting diodes.

It is anticipated that light emitting diodes (LEDs) will replace incandescent and fluorescent light bulbs in the near future due to the low efficiency of the former and the relatively short lifetime of the latter. The industry standard starting material for such LEDs is single crystal gallium nitride. To make a conventional LED, a thin film semiconductor such as GaInN is epitaxially grown on a single crystal GaN layer.

A free-standing GaN substrate can be used for the GaN layer, though existing techniques for the GaN growth are prohibitively expensive to make a product LED cost competitive. Therefore, for most LED substrates employing GaN, the GaN layer is epitaxially grown on an underlying support. Attributes of the support include thermal conductivity, electrical conductivity, and coefficient of thermal expansion among others. However, perhaps the most significant attribute of the support is its lattice constant.

In order to enable epitaxial growth, the support must have a lattice constant that is closely matched to the lattice constant of GaN. Candidate support materials include sapphire, silicon carbide and silicon. While each of these materials has a lattice constant sufficiently close to GaN to enable epitaxial growth, the extent of the lattice mismatch results in performance-limiting defects in the GaN films.

Of the aforementioned candidate support materials, silicon is the most economical. However, silicon also has the largest lattice constant mismatch with GaN. Thus, LEDs made from epitaxial GaN films grown on Si are typically of low quality. On the other hand, while silicon carbide enables the highest quality epitaxial GaN, SiC is the most expensive of the choices. Sapphire is regarded as providing a reasonable compromise between cost and quality for epitaxial GaN.

An alternative approach to providing epitaxial GaN is to form the GaN separately from the substrate and use a layer transfer process to harvest a thin film of the GaN material from the source substrate. The layer transfer process does not require a matching of lattice constants between the GaN film and the support substrate. Indeed, the support substrate need not be crystalline. As a result, rather than focusing on the requirement of a closely-matched lattice constant, the material for the support can be chosen to satisfy other parameters, such as thermal conductivity, electrical conductivity, and coefficient of thermal expansion.

The layer transfer process generally involves cleaving a source wafer along a cleavage plane that is defined by ion implantation into the source wafer. Typically, hydrogen is used as the ion implantation species. An advantage of the layer transfer process is that the hydrogen implant-induced delamination can be repeated many times, so that many thin films can be harvested from an initial free-standing GaN wafer. LEDs can be manufactured from the thus transferred GaN films.

Conventional layer transfer processes involving GaN incorporate a silicon dioxide ($SiO_2$) layer at the GaN surface such that the resulting composite substrate includes a silicon dioxide layer between the GaN and the silicon. The silicon dioxide layer is formed on a surface of the GaN and creates a hydrophilic surface, which can be bonded to another hydrophilic surface. Without wishing to be bound by theory, the formation of a hydrophilic surface in nitride compounds, including gallium nitride, is believed to be very difficult. Thus, silicon oxide can be deposited on the GaN and used as an intervening layer in order to provide a surface suitable for bonding GaN to silicon.

For LED manufacturing, however, an insulating $SiO_2$ layer between the GaN and the support substrate is undesirable. The intervening dielectric layer prohibits the support wafer from serving as an electrical contact for the LED. Thus, in order to use a conventional layer transfer process to provide GaN for LED manufacture, the GaN needs to be de-bonded from the $SiO_2$ and another electrically-conductive layer has to be deposited. Unfortunately, the additional lift-off and deposition steps add cost to the process and to the resulting product.

In view of the foregoing, an economical method for direct bonding GaN or other nitride surfaces to silicon support substrates are highly desirable. Such a direct bonding method would enable low cost manufacturing of composite substrates having a single crystal GaN layer that are suitable for forming high efficiency and low cost LEDs for general lightning.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

SUMMARY

A method of direct bonding GaN and silicon wafers involves rendering the surfaces to be joined ammophilic before contacting. Prior to joining, the surfaces to be joined are treated in ammonia plasma.

A method for forming a hybrid semiconductor structure comprises providing a silicon surface to be bonded and a nitride surface to be bonded, exposing the silicon surface and the nitride surface to an ammonia-containing plasma to form respective ammonia-treated surfaces, joining the ammonia-treated silicon surface and the ammonia-treated nitride surface to form an intermediate bonding structure, and annealing the intermediate bonding structure to form a bonded hybrid semiconductor structure having a bonding interface between the silicon surface and the nitride surface. The method can be used to provide a substrate for forming a light emitting diode.

Plasma treatment of the respective surfaces to be bonded may include exposure of each surface to ammonia-containing plasma to form ammonia radicals on the surfaces, and subsequent exposure of the radical-terminated surfaces to molecular ammonia to form a composite ammonia layer that includes ammonia radicals and molecular ammonia.

DETAILED DESCRIPTION

Gallium nitride and silicon wafers can be direct bonded using an ammonia plasma treatment of the surfaces to be bonded. The ammonia treatment modifies the termination chemistry of the respective surfaces by rendering the surfaces ammophilic.

A method for forming a hybrid semiconductor structure comprises exposing each of a silicon surface and a nitride surface to ammonia-containing plasma to form respective ammonia-treated surfaces, and joining the ammonia-treated silicon surface and the ammonia-treated nitride surface to form an intermediate bonding structure. The intermediate bonding structure is subsequently annealed to form a bonded hybrid semiconductor structure having a bonding interface between the silicon surface and the nitride surface. In embodiments, the bonded hybrid semiconductor structure can comprise a silicon-on-insulator structure.

Figure 1:
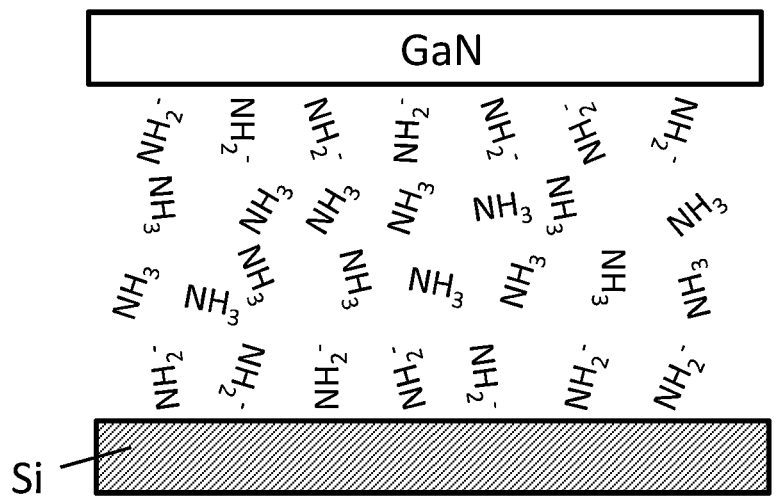
FIG. 1 is a schematic of an intermediate bonding structure between a gallium nitride wafer and a silicon wafer.

In embodiments, the ammonia treatment is carried out is two successive steps. In a first step, the surfaces to be bonded are exposed to active, ammonia-containing plasma. The plasma exposure introduces amido group radicals (e.g., NH$_2^-$ anions) at the respective wafer surfaces. In a second step, the previously plasma-treated surfaces are exposed to molecular ammonia (e.g., NH$_3$), during which step one or more monolayers of ammonia molecules are adsorbed onto the radicalized surface. The treated wafer surfaces can then be contacted to form the intermediate bonding structure, which comprises a bridge of ammonia radicals and molecules between the silicon and the nitride. The intervening layers of radicals and molecules that embodies the intermediate bonding structure is illustrated schematically in FIG. 1.

Figure 2:
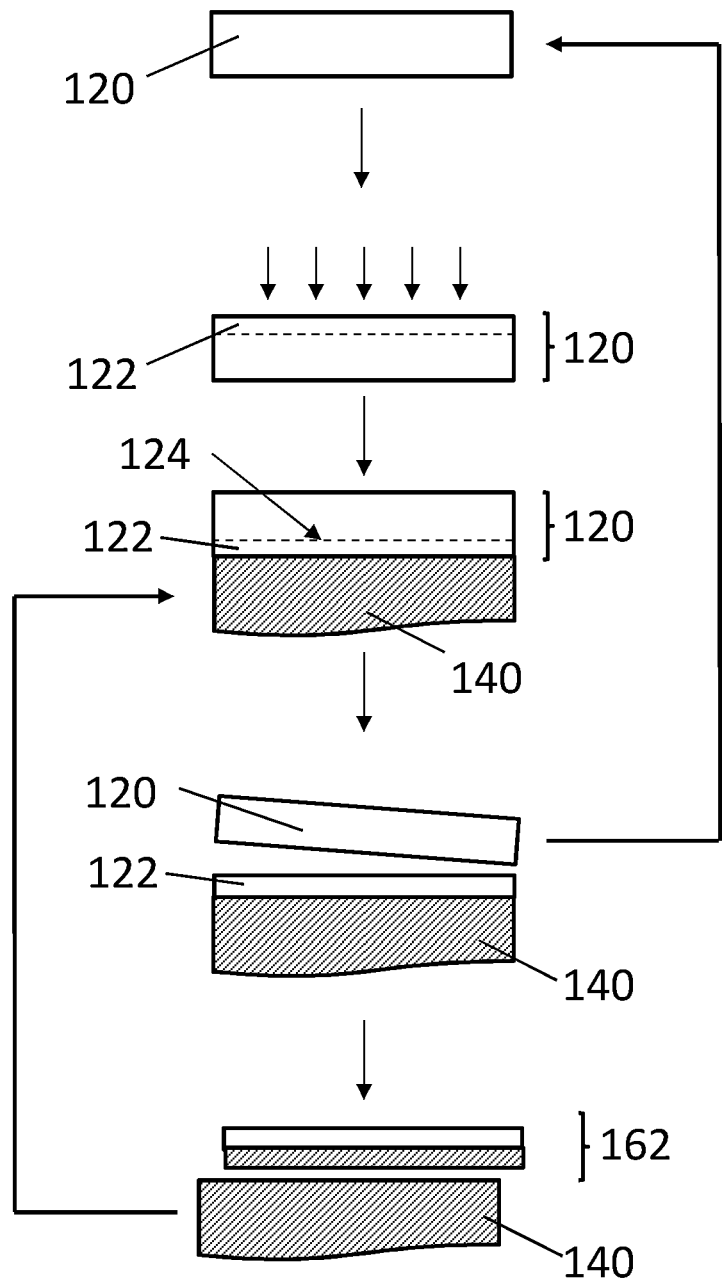
FIG. 2 is a schematic illustration of a portion of a layer transfer process.

The disclosed wafer bonding method can be performed in conjunction with a layer transfer process where, for example, the gallium nitride surface to be bonded is cleaved from a source wafer of GaN. A portion of such a layer transfer process is illustrated schematically in FIG. 2. A single crystal wafer 120 of GaN is ion implanted with hydrogen to a desired depth to define a thin film 122 of GaN to be transferred. The implanted wafer 120 is pre-bonded to a support substrate 140 such as a silicon substrate. The pre-bonded assembly is heated to cause eruption of the hydrogen-rich plane 124 and cleavage of the defined GaN thin film 122 from the GaN wafer 120. The support substrate 140 with the transferred film 122 can then be heated to finalize the bonding between the substrate and the transferred film. The GaN thin film can be surface polished and excess support substrate removed to form a desired structure 162. The GaN source wafer 120 and the excess support substrate 140 can each be recycled back into the process.

In embodiments, pre-bonding of the gallium nitride to a silicon support substrate is accomplished by heating. The pre-bonding heating step may be carried out in conjunction with the heating used to cleave the GaN thin film from the source wafer. As will be appreciated by those skilled in the art, it is desirable that the bond strength of the pre-bond between the GaN wafer and the support substrate is developed prior to cleavage of the GaN substrate and that this initial bond is sufficiently robust to enable the created GaN film to remain attached to the substrate throughout and following the cleavage event.

In the annealing step, heating of the intermediate bonding structure drives off the surface termination species (NH$_2^-$ anions as well as NH$_3$ molecules) and results in a fully-bonded silicon-nitride interface. Annealing of the intermediate bonding structure can carried out at a temperature ranging from 400° C. to 1200° C. for a heating time ranging from 5 to 60 min by using, for example, an oven.

Figure 3:
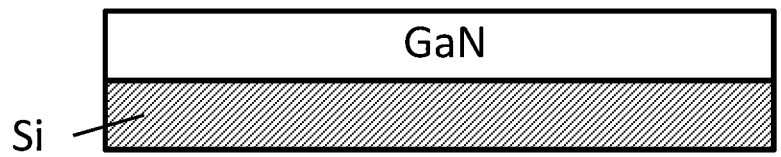
FIG. 3 shows a GaN—Si hybrid structure according to one embodiment of the present disclosure.
Figure 4:
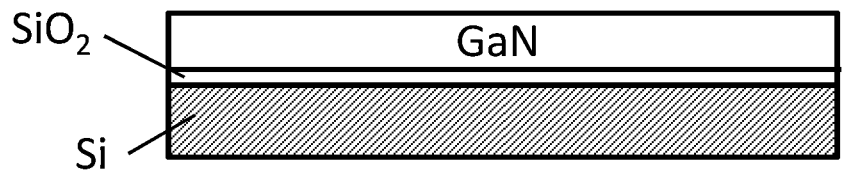
FIG. 4 shows a GaN—SiO$_2$—Si structure produced using conventional layer transfer processing.

In the post-heat-treated hybrid structure, the bonded interface is free of amido group radicals and ammonia, and is also free of oxygen and oxygen-containing species. A schematic of a gallium nitride-silicon hybrid structure produced according to the disclosed methods is illustrated in FIG. 3. A comparative gallium nitride-silicon structure produced according to a conventional layer transfer process is illustrated in FIG. 4. While the comparative structure in FIG. 4 includes an intervening oxide layer between the gallium nitride and the silicon, the gallium nitride-silicon hybrid structure formed using the disclosed process is free of such an interfacial oxide layer.

Prior to forming the ammonia-treated surfaces, each of the wafers to be bonded can be pre-cleaned to remove contaminants including surface-adsorbed species such as water, hydroxyl groups, and as well, in the case of silicon, the native oxide thin film. Etching in an aqueous hydrogen fluoride solution, for example, can be used to remove the SiO$_2$ native oxide from the silicon wafer.

The nitride wafer can comprise a gallium nitride wafer. In the following examples, which illustrate various embodiments of the disclosure, a gallium nitride wafer is direct bonded to a silicon wafer.

Example 1

The gallium nitride (GaN) wafer is a free-standing, translucent substrate measuring 180 microns thick and 2 inches in diameter. The GaN wafer was formed by hydride vapor phase epitaxy (HYPE), and the GaN surface to be bonded was pre-polished to a surface roughness of 0.2 nm RMS. The silicon wafer is a 4 inch diameter prime grade wafer (SEMI standard specification).

Both wafers were initially processed using a conventional RCA clean. In order to remove the native oxide, the silicon wafer was additionally rinsed in a dilute HF bath.

The cleaned wafer were loaded into a reactive ion etch tool (Technics 800 Micro-RIE) having a 13.56 MHz power source. Ammonia was provided to the etch tool as a process gas, and nitrogen was provided as a purge gas.

Plasma processing was performed at base pressure of 1 mTorr and a plasma power of 100 W. The ammonia gas flow rate during plasma processing was 10 sccm. Plasma processing time was 1 minute.

The wafer stage was equipped with a heating/cooling station for evaluating ammophilicity. Prior to the plasma processing, the staged wafers were cooled to −80° C. to prevent liquid anhydrous ammonia from boiling on the surface of the wafer. Wafer cooling was performed under a flow of nitrogen gas to minimize water condensation on the wafer surface.

To estimate ammophilicity, the bonding surface of each wafer was contacted with a drop of liquid anhydrous ammonia. Before the plasma processing, the silicon bonding surface was strongly ammophobic: the wetting angle of the ammonia drop on the silicon was about 120°. Before the plasma processing, the GaN bonding surface was ammoneutral (i.e., neither ammophobic or ammophilic). The wetting angle of the ammonia drop on the GaN surface was approximately 90°.

As a result of the plasma processing, the wetting angle of the ammonia drop on both the silicon bonding surface and the gallium nitride bonding surface was about 30°, which indicates that a degree of ammophilicity was achieved.

After termination of the plasma processing, the chamber was opened and the ammonia-treated, plasma-activated bonding surfaces of the two wafers were immediately joined. With the wafers joined, the propagation of a bonding wave was observed through the translucent GaN wafer. The velocity of the bonding wave was less than 1 cm/sec, which was sufficient to form a void-free intermediate bonding structure, and a void-free hybrid semiconductor structure after annealing of the intermediate structure.

The intermediate bonding structure was annealed at 1000° C. for 30 min. The annealing step removes the ammonia species from the Si—GaN interface and creates a fully-bonded structure. The bond strength was tested by attempting to insert a razor blade between the wafers. A successful, permanent bond was evidenced by breakage of the GaN wafer before any degree of delamination could be measured.

Example 2

In a further example embodiment, a second silicon wafer-gallium nitride wafer pair was prepared in a manner similar to that used in Example 1, except that after the 1 minute plasma processing step, but prior to opening the chamber and joining the wafers, the chamber was purged with ammonia gas.

As a result of the plasma processing and additional exposure to molecular ammonia, the wetting angle of the ammonia drop on both the silicon bonding surface and the gallium nitride bonding surface was less than 10°, which indicates that a stronger degree of ammophilicity was achieved than with the plasma processing only approach of Example 1.

After termination of the plasma and ammonia gas processing, the chamber was opened and the plasma-activated and ammonia-treated bonding surfaces of the two wafers were immediately joined. The velocity of the bonding wave was several centimeters per second, which resulting in a completely bonded Si—GaN structure in less than 2 seconds. The strong attractive force between the wafers can be used to form a void-free hybrid semiconductor structure after annealing of the intermediate structure. The stronger attractive force may be used to bond substantially flat as well as bowed wafers with high yield. The intermediate bonding structure was annealed at 1000 C for 30 min.

The ability to consistently bond bowed wafers as well as flat wafers may be important, for instance, in the case of layer transfer-derived GaN wafers, where the high dose of hydrogen ion implantation (e.g., on the order of $1-3\times10^{17}/cm^2$) can induce significant stresses and concomitant warping of the GaN wafers.

A sufficiently strong attractive force between the respective bonding surfaces can overcome the strain and yield a high-quality composite structure with a void-free bonding interface. Such a bonded hybrid semiconductor structure can be used, for example, to fabricate low cost, high efficiency LEDs.

As used herein, the singular forms "a," "an" and "the" include plural referents unless the context clearly dictates otherwise. Thus, for example, reference to a "metal" includes examples having two or more such "metals" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component of the present invention being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

It will be apparent to those skilled in the art that various modifications and variations can be made to the present invention without departing from the spirit and scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method for forming a hybrid semiconductor structure, said method comprising:
   providing a silicon surface and a nitride surface;
   exposing the silicon surface and the nitride surface to an ammonia-containing plasma to form plasma-treated surfaces;
   exposing the plasma-treated surfaces to molecular ammonia to form respective ammonia-treated surfaces;
   joining the ammonia-treated silicon surface and the ammonia-treated nitride surface to form an intermediate bonding structure; and
   annealing the intermediate bonding structure to form a bonded hybrid semiconductor structure having a bonding interface between the silicon surface and the nitride surface.

2. The method according to claim 1, wherein the nitride surface comprises gallium nitride.

3. The method according to claim 1, wherein the ammonia-treated surfaces comprise ammonia radicals.

4. The method according to claim 1, wherein the ammonia-treated surfaces comprise molecular ammonia.

5. The method according to claim 1, wherein the ammonia-treated surfaces comprise ammonia radicals and molecular ammonia.

6. The method according to claim 1, wherein the ammonia-treated surfaces comprise ammonia radicals in contact with each surface to be bonded and molecular ammonia in contact with the ammonia radicals.

7. The method according to claim 1, wherein the annealing is effective to remove ammonia radicals and molecular ammonia from the ammonia-treated silicon surface and the ammonia-treated nitride surface.

8. The method according to claim 1, wherein the bonding interface is substantially free of oxygen.

9. The method according to claim 1, wherein the bonded hybrid semiconductor structure is a silicon-on-insulator structure.

* * * * *